350-320

CROSS REFERENCE SEARCH ROOM

May 5, 1970 G. D. FRANKSON 3,510,371

METHOD OF MAKING AN ULTRAVIOLET SENSITIVE TEMPLATE

Filed Jan. 25, 1967

INVENTOR.
GARY D. FRANKSON

BY Arthur T. Fessler

ATTORNEY

United States Patent Office 3,510,371
Patented May 5, 1970

3,510,371

METHOD OF MAKING AN ULTRAVIOLET SENSITIVE TEMPLATE

Gary D. Frankson, Hicksville, N.Y., assignor to International Telephone and Telegraph Corporation, Nutley, N.J., a corporation of Maryland Filed Jan. 25, 1967, Ser. No. 611,746
Int. Cl. G02b *1/00;* C23f *1/02;* B44c *1/22*
U.S. Cl. 156—11 2 Claims

ABSTRACT OF THE DISCLOSURE

A mask for photoprocessing of semiconductor devices. The mask is utilized for the selective exposure of photoresists which are sensitive to ultraviolet radiation. The photomask comprises a glass substrate which is transparent to both visible and ultraviolet radiation, and a silicon monoxide layer deposited on one surface of the glass substrate in accordance with the desired pattern. The silicon monoxide layer is transparent to visible light but opaque to ultraviolet radiation.

BACKGROUND OF THE INVENTION

This invention relates to improvements in microcircuit manufacturing techniques, and more particularly to an improved process for photo-etching of diffusion, deposition and etching masks used in conjunction with such manufacturing techniques.

Presently employed techniques for the manufacture of monolithic integrated circuits, thin film circuits, and other types of micro-circuits employ a number of selective diffusion and selective deposition operations, said operations being carried out by means of a suitable mask deposited on the microcircuit surface which is to be subjected to the particular operation to be performed. This mask is generally made by depositing a layer of photoresist on the surface to be masked, and subsequently photoetching the photoresist masking layer. The photoresist is typically a material sensitive to ultraviolet light and exposure is accomplished by a contact printing process employing a suitable printing template in direct contact with the photoresist masking layer.

This contact printing of the photoresist masking layer is necessitated by the required high resolution and close tolerances of the resultant diffusion or deposition mask. The contact printing template in most widespread use at the present time comprises a glass slide which has been coated on one surface thereof with a photosensitive emulsion and subsequently etched so that a pattern corresponding to that of the desired mask to be formed is produced by selective removal of portions of said emulsion. The contact printing process is then carried out by placing the glass slide on the surface to be masked so that the emulsion template is in direct contact with the photoresist masking layer. Due to abrasion between the emulsion template and the photoresist masking layer, the template becomes rapidly degraded and is usable only a limited number of times (on the order of ten applications) before it must be discarded if the required resolution and tolerances are to be maintained.

An alternative template presently being employed in microcircuit manufacture is the so-called "hard" type, employing a metal coating (typically chrome) on a glass substrate. The metal coating is substantially harder than the photoresist emulsion and therefore has greater resistance to abrasion and a usable life substantially greater than that of the conventional photoresist template. In addition, the greater mechanical and thermal stability of the metal template permits attainment of improved resolution and tolerances.

A disadvantage of the "hard" template is the relatively high expense of fabrication in comparison with the conventional photoresist template.

In the manufacture of monolithic integrated circuits, several consecutive diffusion and/or deposition steps are usually required to be carried out on the same surface. In such applications, it is therefore necessary to achieve extremely accurate alignment of each template with respect to the surface in order to assure proper registration of the various diffused and deposited areas subsequently formed in conjunction with corresponding masking layers deposited on said surface. Since a large portion of the areas of both the conventional photoresist template and the metallic "hard" template are opaque to visible light, alignment of the template with the underlying surface is generally a tedious and difficult process.

Accordingly, an object of the present invention is to provide an improved process for the fabrication of diffusion and/or deposition masks on microcircuits.

Another object of the invention is to provide an improved process for the fabrication of such masks wherein alignment of the photoetching template with the photoresist layer to be masked is greatly faciiltated.

SUMMARY

These, and other objects which will become apparent by reference to the following detailed description taken in conjunction with the accompanying drawings and appended claims, are achieved by (i) utilization of a transparent template having a silicon monoxide film selectively deposited on one surface thereof in a pattern corresponding to that of the desired diffusion and/or deposition mask to be formed, and (ii) exposing the photoresist masking layer on the microcircuit surface to be masked to ultraviolet light through said template. The silicon monoxide template, being transparent to visible light, greatly facilitates alignment thereof with the surface to be masked. The silicon monoxide template is substantially harder than the conventional photoresist emulsion template and therefore has considerably greater useful life. Since silicon monoxide absorbs ultraviolet light, however, it is completely effective as a photomask for the underlying ultraviolet light-sensitive photoresist masking layer deposited on the surface to be processed.

DETAILED DESCRIPTION

Figure 1A:
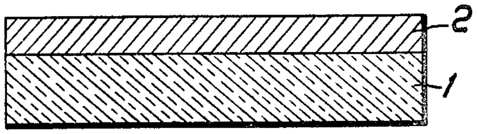
FIGS. 1A to 1E show the steps involved in fabricating a silicon monoxide photomask template according to the invention.
Figure 1B:
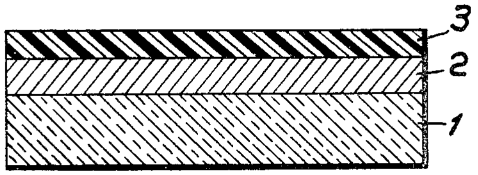
Figure 1C:
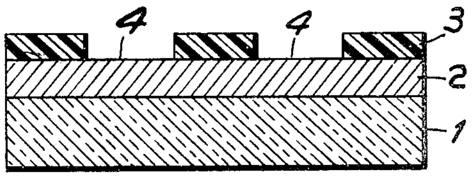
Figure 1D:
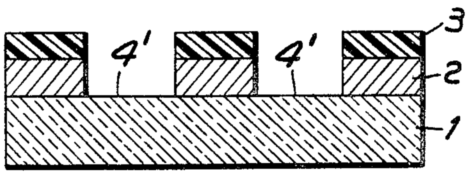
Figure 1E:
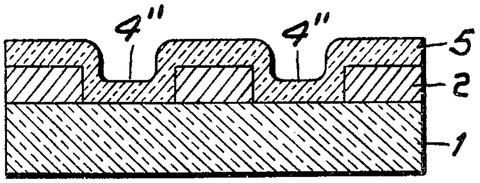
Figure 1F:
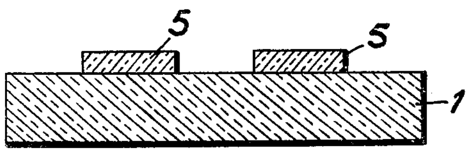

As shown at A, a glass slide 1, which may typically be on the order of two inches square by approximately 1/32 inch thick, is coated with a thin layer of an adherent metal, preferably aluminum. Where aluminum is employed, it has been found that the adherent film 2 should have a minimum thickness on the order of approximately 1.5 microns in order to insure proper formation of the silicon monoxide template during subsequent fabrication steps.

It should be kept in mind that the glass substrate 1 should preferably be selected to have reasonably good transmissibility at both visible and ultraviolet wavelengths.

A coating 3 of a suitable photosensitive auto-positive resist 3 is then deposited atop the aluminum film 2 as shown at B. The auto-positive resist is one in which the areas exposed to ultraviolet light (or other suitable radiation) undergo a change such that these areas become soluble in a particular developer solution, the net result being that the resist material is removed in those areas which have been irradiated. In contradistinction, conventional (negative) photoresists undergo polymerization in the areas exposed to ultraviolet light; the polymerized areas are resistant to a particular developer solution, while the unexposed areas are soluble therein—the net result being that those areas which have not been irradiated are removed during the developing process. A suitable auto-positive resist for use according to the present invention is that designated as Azoplate XP–1300 by H. L. Shipley Co.

The auto-positive resist coating 3 is then exposed to ultraviolet radition through a suitable master photoplate having a pattern corresponding to that of the desired diffusion or deposition mask. The selected portions 4 of the auto-positive resist coating 3 which have been irradiated by the ultraviolet light transmitted by the transmissive areas of said master photoplate are subsequently removed when the substrate 1 is immersed in a suitable developer solution which may, for example, be that designated as AZ1350 Developer by H. L. Shipley Co. The substrate 1 is then rinsed in de-ionized water. The resultant structure at this point in the fabrication process is shown at C in the drawing.

The template is then immersed in a strong aluminum etch, e.g. a solution of phosphoric acid ($H_3PO_4$); nitric acid ($HNO_3$); acetic acid (HAC); and de-ionized water in the respective relative proportions of 76:3:15:5, removing the portions of the aluminum film in the areas 4′ underlying the removed areas of the auto-positive photoresist coating 3, as shown at D.

The next step is the vacuum deposition of silicon monoxide upon the entire coated surface of the substrate 1. Such deposition may be accomplished, e.g., by electron beam bombardment of silicon monoxide pellets in the vicinity of the substrate 1 under a pressure of approximately $4.0\times10^{-6}$ torr, the deposition time being such as to produce the particular film thickness desired, thus instituting pyrolytic deposition of silicon monoxide upon the substrate surface. The thickness of the deposited silicon monoxide film 5, which covers the exposed areas 4″ of the glass substrate 1 as well as the aluminum covered areas thereof, may preferably be on the order of 1.5 microns. The silicon monoxide film thickness, however, is not critical, thinner films thereof being under proper conditions, sufficiently opaque to ultraviolet light to serve the desired photomask function.

It is preferable to remove the auto-positive resist 3 from the template by immersion in a suitable solvent, the aluminum film 2 being impervious to said solvent, before proceeding with the silicon monoxide deposition, the resultant structure after deposition being shown at E.

The template is now immersed in the aforementioned strong aluminum etch, the silicon monoxide being impervious to said etch, so that the portions of the aluminum film underlying corresponding parts of the silicon monoxide layer are lifted or washed away from the glass substrate 1, thus removing the overlying parts of the silicon monoxide film 5 associated with said aluminum portions.

The resultant finished template photomask structure, as shown at F in the drawing, comprises a glass substrate 1 transparent to both visible and ultraviolet light, selected portions of which are coated with a thin layer 5 of silicon monoxide which is transparent to visible light but opaque to ultraviolet light, the pattern of said portions corresponding to that of the diffusion or deposition mask which is to be produced thereby.

The silicon monoxide layer 5, although substantially transparent to visible light, has an ultraviolet absorption characteristic extending well into the blue end of the visible spectrum, thus giving the layer 5 a characteristic brownish tint. The transparency of the silicon monoxide layer 5 as well as the substrate 1 to visible light greatly facilitates the alignment of the template with suitable markings on the photoresist-coated microcircuit wafer to be processed, while the characteristic brownish tint of the silicon monoxide layer enables visible differentiation from the glass substrate 1.

The microcircuit to be processed, after being coated with a suitable ultraviolet sensitive conventional (negative) photoresist, is then covered with the template shown at F so that the silicon monoxide layer 5 is in contact with the photoresist masking layer.

The conventional photoresist masking layer is then exposed to ultraviolet light through the silicon monoxide template. After exposure, the masking layer is developed by immersion in a suitable solvent which dissolves those areas not irradiated by the ultraviolet light. The resultant photoresist mask may then be utilized in connection with conventional vapor phase or solid diffusion, selective deposition or etching processes.

While the principles of the invention have been described above in connection with specific embodiments, and particular modifications thereof, it is to be clearly understood that this description is made only by way of example and not as a limitation on the scope of the invention.

I claim:

1. A method of forming a template on a glass substrate, said glass being transparent to both visible and ultraviolet light, comprising the steps of:

depositing a layer of aluminum on one surface of said substrate, said aluminum having a thickness exceeding 1.5 microns;

coating said aluminum layer with a photosensitive resist;

subjecting said resist coating to ultraviolet radiation through a master photoplate, said photoplate allowing the ultraviolet radiation to selectively irradiate onto said resist;

removing selected portions of said resist to expose at least a portion of said aluminum layer in accordance with the desired template pattern;

immersing said exposed aluminum portions in an aluminum etching solution to expose the surface of said substrate in accordance with the desired template pattern, said etching solution consisting essentially of phosphoric acid, nitric acid, acetic acid and deionized water;

removing the remaining portions of said resist;

depositing a layer of silicon monoxide over said aluminum and the exposed substrate surface only, said deposition continuing until said layer is sufficiently thick to be opaque to ultraviolet light while being transparent to visible light; and immersing said substrate in said aluminum etchant solution, said silicon monoxide being impervious to said etchant so that portions of the remaining aluminum layer underlying corresponding parts of said silicon monoxide layer are removed from said substrate along with the overlying parts of said silicon monoxide layer thereby leaving a layer of silicon monoxide on said substrate in accordance with the desired template pattern.

2. A process according to claim 1, wherein the thickness of said silicon monoxide film exceeds a minimum value on the order of 1.5 microns.

References Cited

UNITED STATES PATENTS 2,999,034 9/1961 Heidenhain ---------- 117—5.5

JACOB H. STEINBERG, Primary Examiner

U.S. Cl. X.R.

156—3, 17; 96—27, 36.2; 350—320; 161—2